US012648269B2

(12) United States Patent     (10) Patent No.:   US 12,648,269 B2

Chang                  (45) Date of Patent:       Jun. 2, 2026

(54) WAVELENGTH CONVERSION ELEMENT AND PROJECTION APPARATUS

(71) Applicant: Coretronic Corporation, Hsin-Chu (TW)

(72) Inventor: Kuo-Chou Chang, Hsin-Chu (TW)

(73) Assignee: Coretronic Corporation, Hsin-Chu (TW)

( * ) Notice: Subject to any disclaimer, the term of this patent is extended or adjusted under 35 U.S.C. 154(b) by 481 days.

(21) Appl. No.: 17/943,206

(22) Filed: Sep. 13, 2022

(65) Prior Publication Data

US 2023/0097260 A1     Mar. 30, 2023

(30) Foreign Application Priority Data

Sep. 28, 2021    (CN) .......................... 202122355706.8

(51) Int. Cl.
*H10H 20/851*      (2025.01)
*H10H 20/814*      (2025.01)
*H10H 20/858*      (2025.01)

(52) U.S. Cl.
CPC ........ *H10H 20/851* (2025.01); *H10H 20/814* (2025.01); *H10H 20/8583* (2025.01)

(58) Field of Classification Search
CPC ............... H10H 20/814; H10H 20/851; H10H 20/8515; H10H 20/856; H10H 20/8583
See application file for complete search history.

(56) References Cited

U.S. PATENT DOCUMENTS

| | | | | |
|---|---|---|---|---|
| 2019/0353997 A1* | 11/2019 | Hsu | ...................... | H04N 9/3161 |
| 2020/0132261 A1* | 4/2020 | Tsai | ......................... | F21K 9/64 |
| 2021/0096357 A1* | 4/2021 | Li | ........................... | G03B 21/16 |
| 2021/0208491 A1* | 7/2021 | Tanaka | ..................... | F21V 9/40 |
| 2021/0231944 A1* | 7/2021 | Bai | ....................... | G02B 26/008 |

FOREIGN PATENT DOCUMENTS

| | | |
|---|---|---|
| CN | 104597698 | 5/2015 |
| CN | 105319697 | 2/2016 |
| CN | 105867057 | 3/2018 |
| CN | 208937894 | 6/2019 |
| CN | 110168418 | 8/2019 |

* cited by examiner

*Primary Examiner* — Matthew C Landau
*Assistant Examiner* — Dmitriy Yemelyanov
(74) *Attorney, Agent, or Firm* — JCIPRNET

(57)        ABSTRACT

A wavelength conversion element including a substrate, a wavelength conversion layer, a reflective layer, and a heat conduction and diffusion substrate is provided. The reflective layer is disposed between the substrate and the wavelength conversion layer, and the wavelength conversion layer is disposed between the heat conduction and diffusion substrate and the reflective layer. The wavelength conversion element is configured to receive an excitation light beam. The heat conduction and diffusion substrate is configured to allow the excitation light beam to pass through. The wavelength conversion layer is configured to receive and convert the excitation light beam into a converted light beam. The reflective layer is configured to reflect the converted light beam, and the heat conduction and diffusion substrate is configured to allow the converted light beam to pass through.

20 Claims, 9 Drawing Sheets

200

WAVELENGTH CONVERSION ELEMENT AND PROJECTION APPARATUS

CROSS-REFERENCE TO RELATED APPLICATION

This application claims the priority benefit of China application serial no. 202122355706.8, filed on Sep. 28, 2021. The entirety of the above-mentioned patent application is hereby incorporated by reference herein and made a part of this specification.

BACKGROUND

Technical Field

The disclosure relates to a wavelength conversion element and a projection apparatus using the wavelength conversion element.

Description of Related Art

In a conventional projector, the wavelength conversion element is formed by a specular reflection substrate (heat dissipation substrate) and a phosphor layer or is formed by a substrate, an organic or inorganic diffuse reflection layer, and a phosphor layer. However, when the laser is irradiated on the upper surface of the phosphor layer, heat energy may be easily generated and accumulated. Therefore, heat is required to be conducted through the phosphor layer to the lower surface of the phosphor layer and is required to be dissipated from the heat dissipation substrate. However, the thermal conductivity of the phosphor layer is low, laser heat may thus be easily accumulated on the upper surface of the phosphor layer. As a result, thermal degradation may occur in the phosphor layer, and light conversion efficiency may thus be affected.

The information disclosed in this BACKGROUND section is only for enhancement of understanding of the background of the described technology and therefore it may contain information that does not form the prior art that is already known to a person of ordinary skill in the art. Further, the information disclosed in the BACKGROUND section does not mean that one or more problems to be resolved by one or more embodiments of the disclosure was acknowledged by a person of ordinary skill in the art.

SUMMARY

The disclosure provides a wavelength conversion element in which a temperature of a wavelength conversion layer is effectively reduced.

The disclosure further provides a projection apparatus using the above wavelength conversion element, such that the projection apparatus provides improved light conversion efficiency.

An embodiment of the disclosure provides a wavelength conversion element including a substrate, a wavelength conversion layer, a reflective layer, and a heat conduction and diffusion substrate. The reflective layer is disposed between the substrate and the wavelength conversion layer, and the wavelength conversion layer is disposed between the heat conduction and diffusion substrate and the reflective layer. The wavelength conversion element is configured to receive an excitation light beam. The heat conduction and diffusion substrate is configured to allow the excitation light beam to pass through. The wavelength conversion layer is configured to receive and convert the excitation light beam into a converted light beam. The reflective layer is configured to reflect the converted light beam, and the heat conduction and diffusion substrate is configured to allow the converted light beam to pass through.

In an embodiment of the disclosure, the heat conduction and diffusion substrate is in direct contact with the substrate, and heat energy generated by the wavelength conversion layer is conducted to the substrate through the heat conduction and diffusion substrate.

In an embodiment of the disclosure, a thermal conductivity of the heat conduction and diffusion substrate is greater than a thermal conductivity of the wavelength conversion layer, and a light diffusion angle of the heat conduction and diffusion substrate is within a range of 0.5 degrees to 5 degrees.

In an embodiment of the disclosure, the heat conduction and diffusion substrate has a first surface and a second surface opposite to the first surface. The second surface faces the wavelength conversion layer, and the first surface includes a plurality of microstructures.

In an embodiment of the disclosure, a thickness of the heat conduction and diffusion substrate is within a range of 0.5 mm to 1.5 mm, and a thickness of each of the plurality of microstructures is within a range of 0 mm to 1.0 mm.

In an embodiment of the disclosure, the plurality of microstructures are arc-shaped microstructures and are arranged in a ring shape around a center of the substrate.

In an embodiment of the disclosure, the plurality of microstructures are square microstructures, spherical microstructures, or radial microstructures, and the plurality of microstructures are arranged in an array and are arranged in a concentric ring shape around a center of the substrate.

In an embodiment of the disclosure, the substrate has a third surface, and the third surface includes a groove. The wavelength conversion layer, the reflective layer, and the heat conduction and diffusion substrate are arranged in the groove.

In an embodiment of the disclosure, the substrate has a third surface, and the third surface includes a groove. A portion of the wavelength conversion layer and the reflective layer are disposed in the groove.

In an embodiment of the disclosure, an adhesive layer arranged between the heat conduction and diffusion substrate and the substrate is further included.

In an embodiment of the disclosure, the substrate has a third surface, and the reflective layer is disposed on the third surface. The third surface is a plane.

An embodiment of the disclosure further provides a projection apparatus including an illumination system, a light valve, and a projection lens. The illumination system is configured to provide an illumination light beam. The light valve is disposed on a transmission path of the illumination light beam and is configured to convert the illumination light beam into an image light beam. The projection lens is disposed on a transmission path of the image light beam and is configured to project the image light beam out of the projection apparatus. The illumination system includes a light source and a wavelength conversion element. The light source is configured to emit an excitation light beam. The wavelength conversion element includes a substrate, a wavelength conversion layer, a reflective layer, and a heat conduction and diffusion substrate. The reflective layer is disposed between the substrate and the wavelength conversion layer, and the wavelength conversion layer is disposed between the heat conduction and diffusion substrate and the reflective layer. The excitation light beam is incident on the wavelength conversion element. The excitation light beam passes through the heat conduction and diffusion substrate, is then received by the wavelength conversion layer, and is converted into a converted light beam. The converted light beam reflects off the reflective layer and passes through the heat conduction and diffusion substrate.

Based on the above description, in an embodiment of the disclosure, since the wavelength conversion element is provided with the heat conduction and diffusion substrate on the wavelength conversion layer, the heat energy accumulated on the wavelength conversion layer is effectively taken away, which mitigates the problem of thermal degradation and improves the light energy conversion efficiency of the wavelength conversion layer. Since the projection apparatus of an embodiment of the disclosure uses the aforementioned wavelength conversion element, the light energy conversion efficiency of the projection apparatus is improved.

Other objectives, features and advantages of the present disclosure will be further understood from the further technological features disclosed by the embodiments of the present disclosure wherein there are shown and described preferred embodiments of this disclosure, simply by way of illustration of modes best suited to carry out the disclosure.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

In the following detailed description of the preferred embodiments, reference is made to the accompanying drawings which form a part hereof, and in which are shown by way of illustration specific embodiments in which the disclosure may be practiced. In this regard, directional terminology, such as "top," "bottom," "front," "back," etc., is used with reference to the orientation of the Figure(s) being described. The components of the present disclosure can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present disclosure. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1:
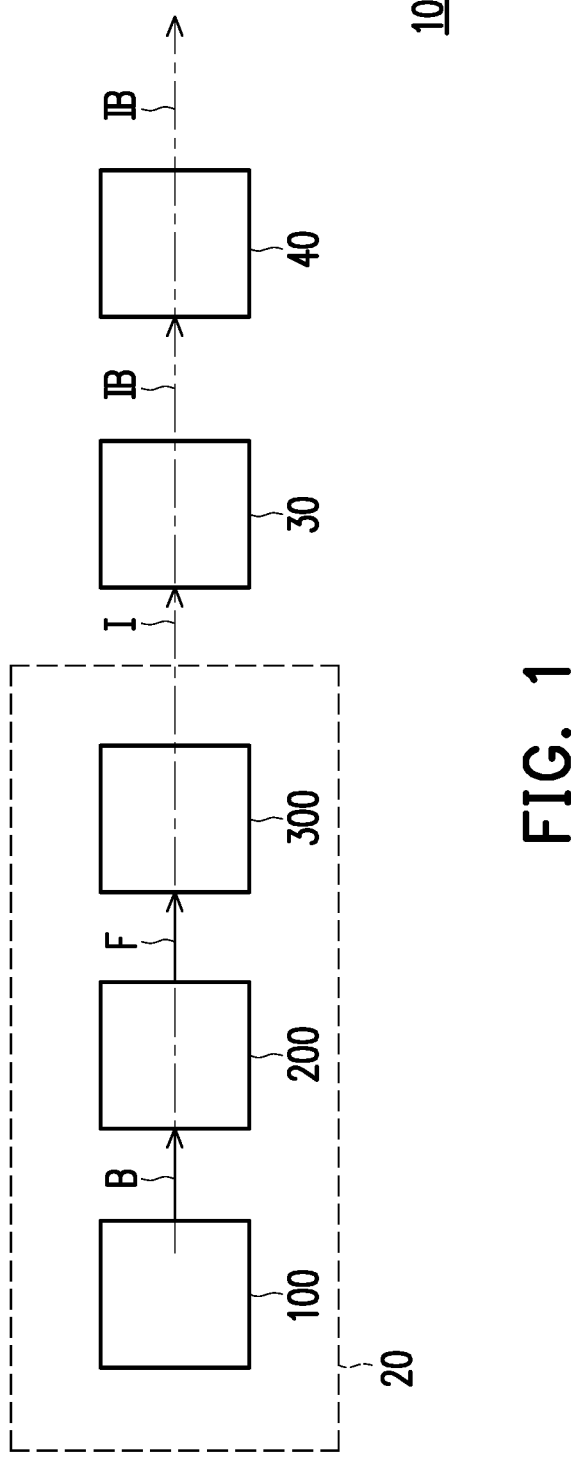
FIG. 1 is a schematic diagram of a projection apparatus according to a first embodiment of the disclosure.

FIG. 1 is a schematic diagram of a projection apparatus according to a first embodiment of the disclosure. Referring to FIG. 1, an embodiment of the disclosure provides a projection apparatus 10 including an illumination system 20, a light valve 30, and a projection lens 40. The illumination system 20 is configured to provide an illumination light beam I. The light valve 30 is disposed on a transmission path of the illumination light beam I and is configured to convert the illumination light beam I into an image light beam IB. The projection lens 40 is disposed on a transmission path of the image light beam IB and is configured to project the image light beam IB out of the projection apparatus 10.

In detail, the light valve 30 of the embodiment is, for example, a spatial light modulator such as a digital micro-mirror device (DMD), a liquid crystal-on-silicon panel (LCOS panel), or a liquid crystal panel, etc. In addition, the projection lens 40 is, for example, a combination of one or more optical lenses having refracting power. The optical lens includes, for example, a non-planar lens such as a biconcave lens, a biconvex lens, a concavo-convex lens, a convexo-concave lens, a plano-convex lens, a plano-concave lens, etc, or various combinations thereof. The form and type of the projection lens 40 are not limited in the disclosure.

In the embodiment, the illumination system 20 includes a light source 100 and a wavelength conversion element 200. The light source 100 is configured to emit an excitation light beam B. The light source 100 is, for example, a laser diode (LD), a light emitting diode (LED), or other suitable light sources or a combination thereof, which is not limited in the disclosure. In an embodiment, the illumination system 20 further includes a light homogenizing element 300. The light homogenizing element 300 is, for example, an integration rod, a lens array, or other optical elements with a light homogenizing effect, but the disclosure is not limited thereto.

Figure 2A:
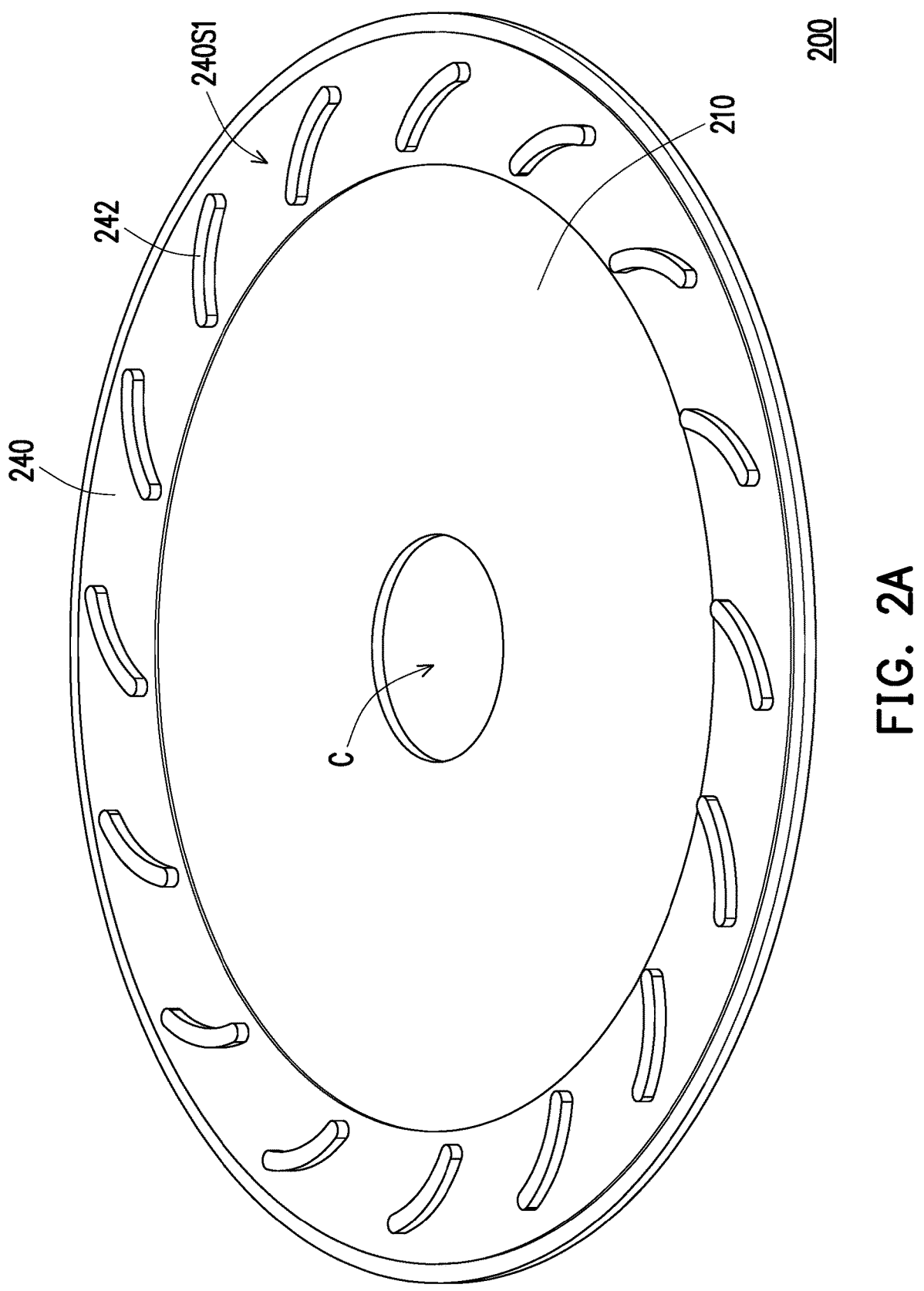
FIG. 2A is a schematic three-dimensional view of a wavelength conversion element of FIG. 1.
Figure 2B:
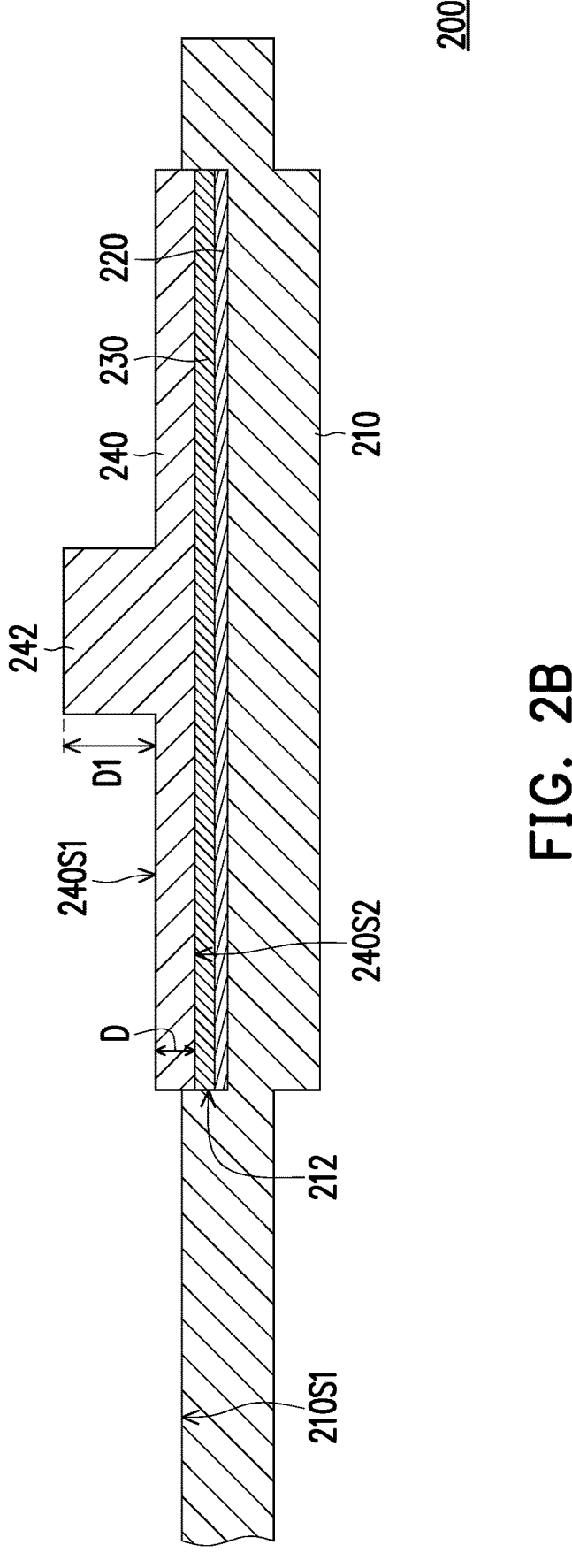
FIG. 2B is a schematic cross-sectional view of FIG. 2A.

FIG. 2A is a schematic three-dimensional view of a wavelength conversion element of FIG. 1. FIG. 2B is a schematic cross-sectional view of FIG. 2A. Referring to FIG. 1, FIG. 2A, and FIG. 2B, in the embodiment, the wavelength conversion element 200 is, for example, a phosphor wheel. The wavelength conversion element 200 includes a substrate 210, a reflective layer 220, a wavelength conversion layer 230, and a heat conduction and diffusion (light diffusion) substrate 240. A material of the substrate 210 is preferably metal, such as aluminum, and the reflective layer 220 may be formed of a metal oxide, such as a diffuse reflective layer composed of metal oxide powder. In other embodiments, the reflective layer 220 may be a coating layer, which is coated and formed on the substrate 210. The wavelength conversion layer 230 may be a phosphor adhesive layer and has a phosphor material. The heat conduction and diffusion substrate 240 is preferably made of a transparent material with high thermal conductivity, such as aluminum oxide (i.e., sapphire), yttrium oxide, magnesium oxide, aluminum magnesium spinel, yttrium aluminum oxide garnet, or a combination thereof. The heat conduction and diffusion substrate 240 may be a diffusion sheet or a fly-eye lens.

In the embodiment, the reflective layer 220 is disposed between the substrate 210 and the wavelength conversion layer 230, and the wavelength conversion layer 230 is disposed between the heat conduction and diffusion substrate 240 and the reflective layer 220. The excitation light beam B is incident on the wavelength conversion element 200. The excitation light beam B passes through the heat conduction and diffusion substrate 240, is then received by the wavelength conversion layer 230, and is converted into a converted light beam F. The converted light beam F reflects off the reflective layer 220, passes through the heat conduction and diffusion substrate 240, and leaves the wavelength conversion element 200. Herein, the illumination light beam I includes the converted light beam F and the excitation light beam B.

In the embodiment, the substrate 210 has a third surface 210S1, and the third surface 210S1 includes a groove 212. A shape of the groove 212 is, for example, ring shape. The wavelength conversion layer 230, the reflective layer 220, and at least a portion of the heat conduction and diffusion substrate 240 are disposed in the groove 212. A projection area of the groove 212 is, for example, equal to a projection area of the heat conduction and diffusion substrate 240. The wavelength conversion layer 230, the reflective layer 220, and the heat conduction and diffusion substrate 240 are all in contact with sidewalls of the groove 212. Therefore, the heat conduction and diffusion substrate 240 is in direct contact with the substrate 210, so that the heat generated by the wavelength conversion layer 230 is not only conducted to the substrate 210 through the reflective layer 220, but is also conducted to the substrate 210 through the heat conduction and diffusion substrate 240. A thermal conductive effect is thereby further improved.

In the embodiment, a thermal conductivity of the heat conduction and diffusion substrate 240 is greater than a thermal conductivity of the wavelength conversion layer 230. A light diffusion angle of the heat conduction and diffusion substrate 240 is within a range of 0.5 degrees to 5 degrees. Moreover, the heat conduction and diffusion substrate 240 has a plurality of microstructures 242. A thickness (thickness D+thickness D1) of the heat conduction and diffusion substrate 240 is within a range of 0.5 mm to 1.5 mm, and a thickness D1 of each of the microstructures 242 is within a range of 0 mm to 1.0 mm.

In the embodiment, the heat conduction and diffusion substrate 240 has a first surface 240S1 and a second surface 240S2 opposite to the first surface 240S1, where the second surface 240S2 faces and is connected to the wavelength conversion layer 230. The first surface 240S1 of the heat conduction and diffusion substrate 240 includes the plurality of microstructures 242. Side surfaces of the heat conduction and diffusion substrate 240 are in contact with sidewalls of the groove 212. The microstructures 242 are arc-shaped microstructures and are arranged in a ring shape around a center C of the substrate 210. The microstructures 242 are, for example, formed through mechanical processing such as milling, electrical discharge machining, or formed through chemical processing such as chemical etching.

Based on the above description, in the wavelength conversion element 200 of an embodiment of the disclosure, since the wavelength conversion layer 230 is provided with the heat conduction and diffusion substrate 240, the heat energy accumulated on the wavelength conversion layer 230 is conducted to the heat conduction and diffusion substrate 240. In this way, the problem of thermal degradation of the wavelength conversion layer 230 is mitigated, and the light energy conversion efficiency of the wavelength conversion layer 230 is improved. Since the projection apparatus 10 of an embodiment of the disclosure uses the aforementioned wavelength conversion element 200, the projection apparatus 10 may thus provide projection images featuring stable image quality.

Figure 3A:
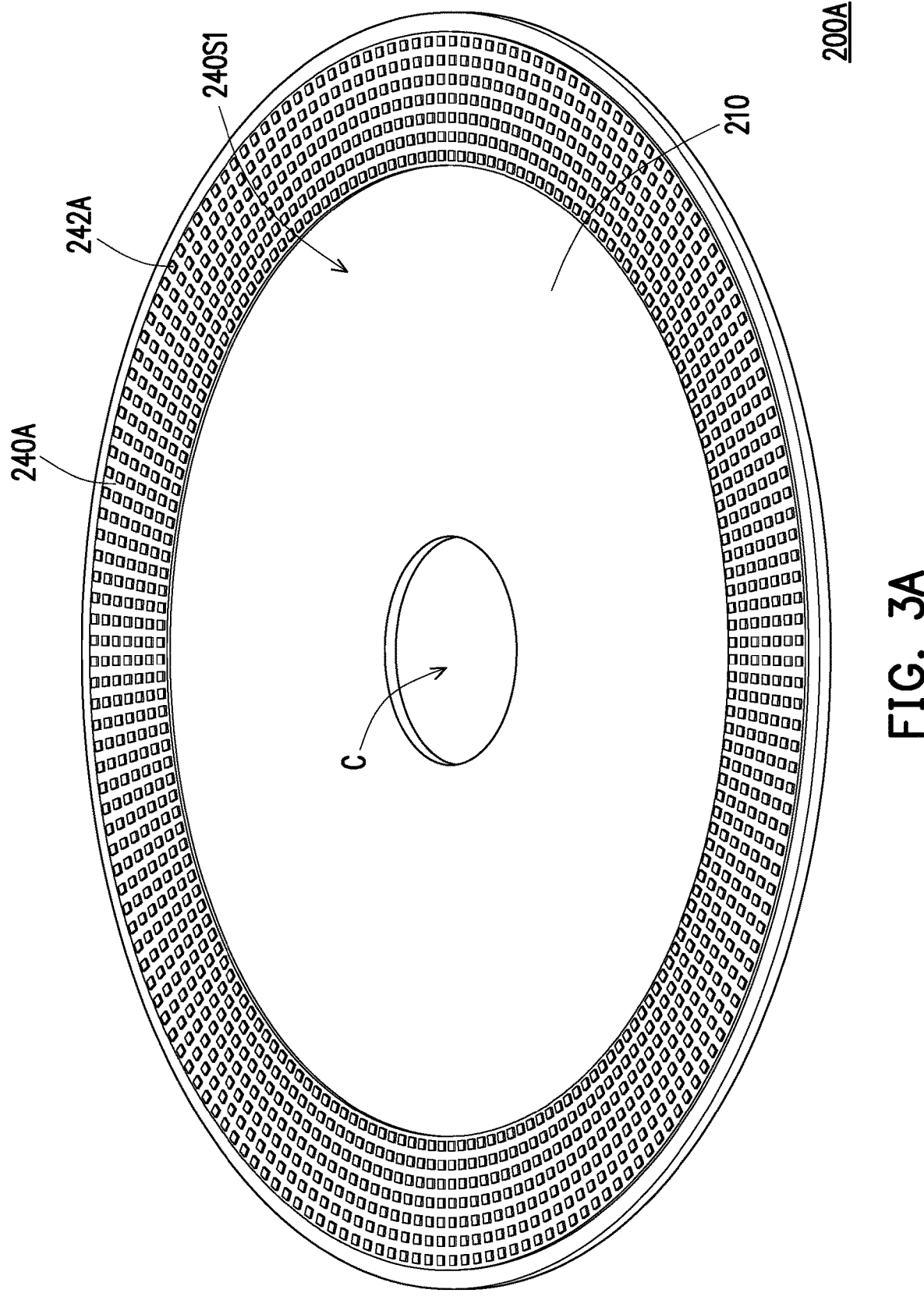
FIG. 3A is a schematic three-dimensional view of a wavelength conversion element according to a second embodiment of the disclosure.
Figure 3B:
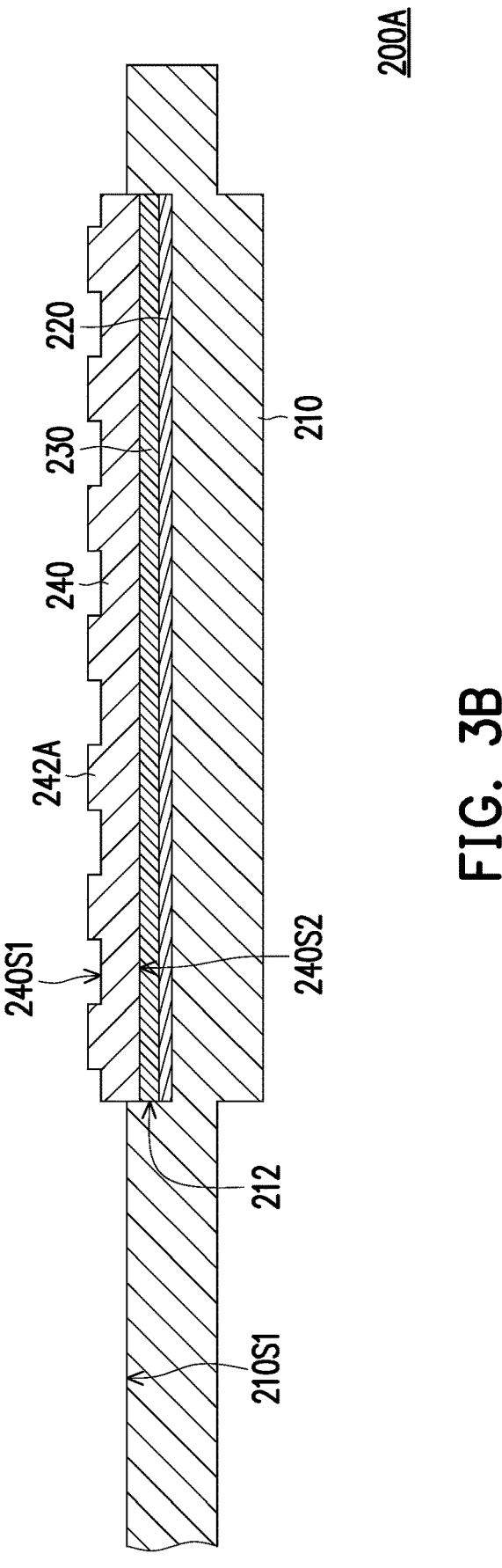
FIG. 3B is a schematic cross-sectional view of FIG. 3A.

In other embodiments, the microstructures are, for example, square microstructures, spherical microstructures, or radial microstructures. FIG. 3A is a schematic three-dimensional view of a wavelength conversion element according to a second embodiment of the disclosure. FIG. 3B is a schematic cross-sectional view of FIG. 3A. Referring to FIG. 3A and FIG. 3B, main differences between a wavelength conversion element 200A and the wavelength conversion element 200 of FIG. 2B are provided as follows. In this embodiment, the microstructures 242A in FIG. 3A are square microstructures. The microstructures 242A are arranged in an array and are arranged in a concentric ring shape around the center C of the substrate 210.

Figure 4A:
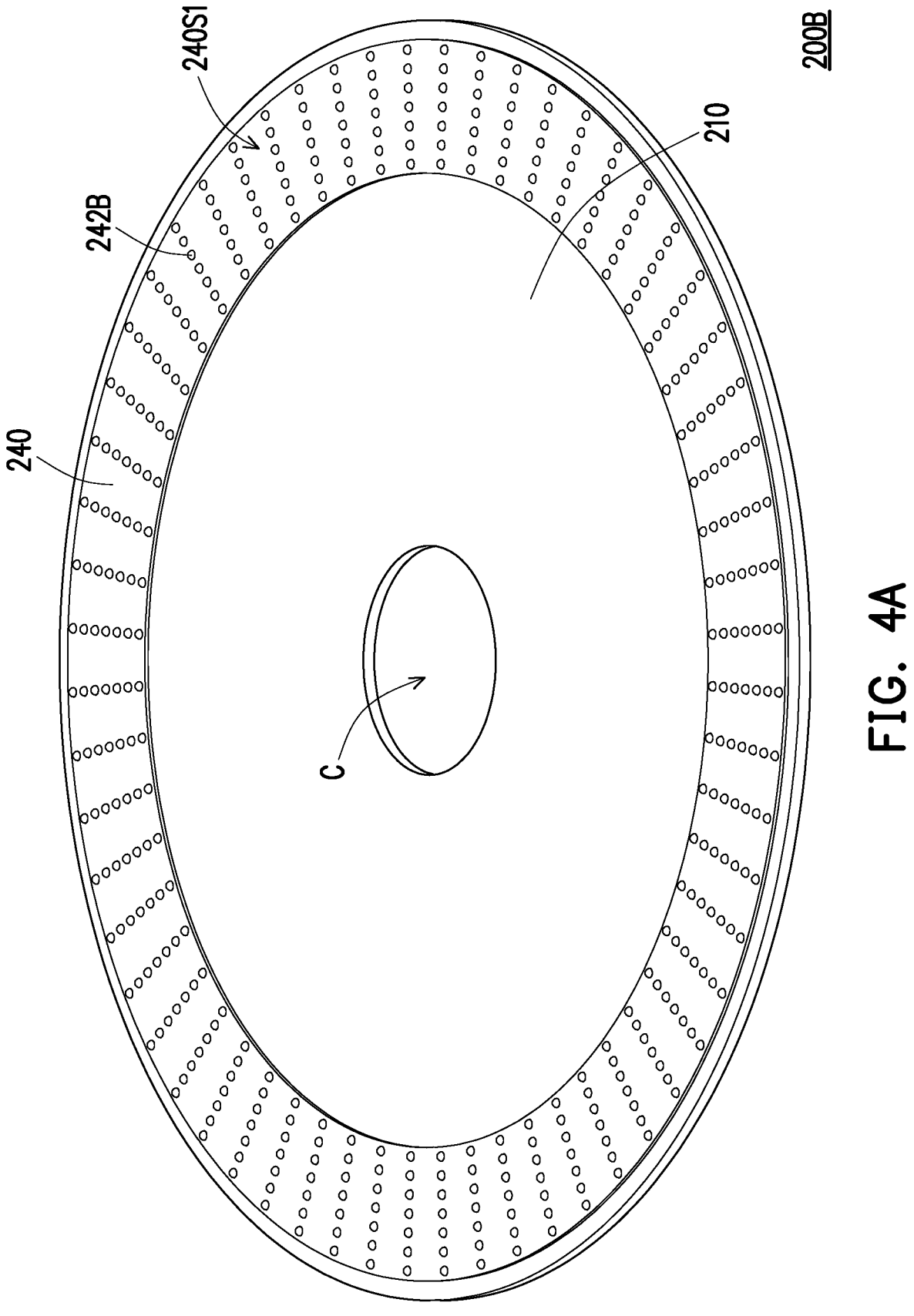
FIG. 4A is a schematic three-dimensional view of a wavelength conversion element according to a third embodiment of the disclosure.
Figure 4B:
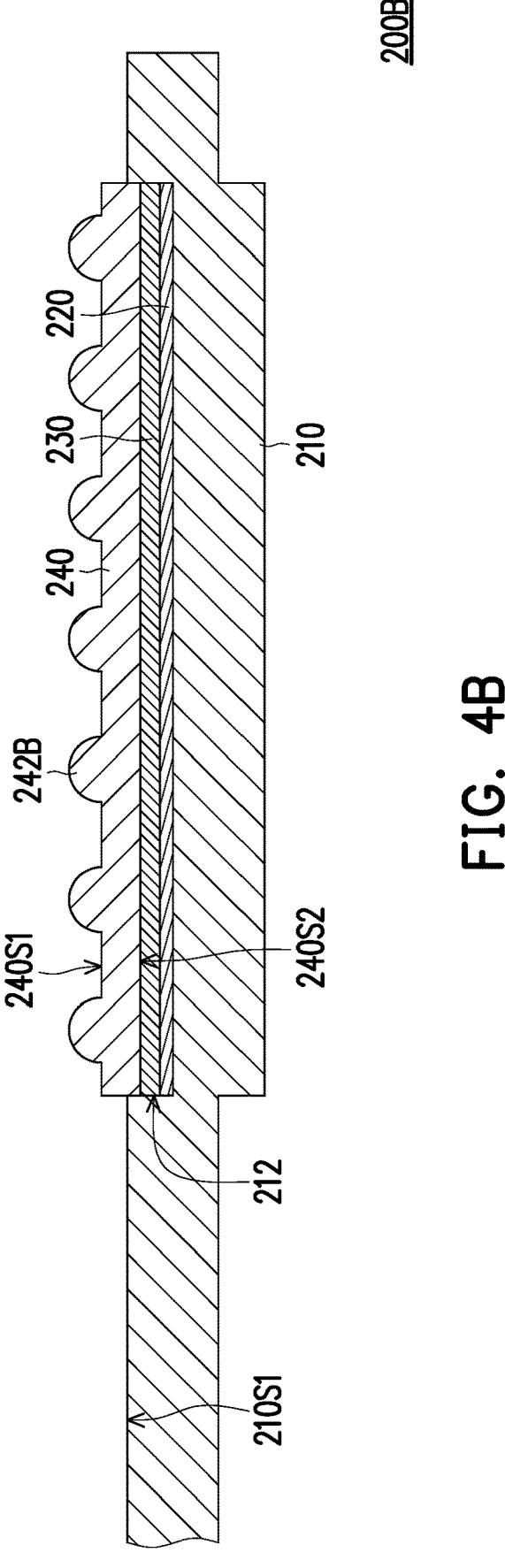
FIG. 4B is a schematic cross-sectional view of FIG. 4A.

FIG. 4A is a schematic three-dimensional view of a wavelength conversion element according to a third embodiment of the disclosure. FIG. 4B is a schematic cross-sectional view of FIG. 4A. Referring to FIG. 4A and FIG. 4B, a main difference between a wavelength conversion element 200B and the wavelength conversion element 200A of FIG. 3A is that microstructures 242B of the wavelength conversion element 200B are spherical microstructures.

The following table 1 illustrates highest temperatures (when the excitation light beam B is incident on the wavelength conversion element) of the respective wavelength conversion layers 230 of the wavelength conversion element 200 of FIG. 2A, the wavelength conversion element 200A of FIG. 3A, and the wavelength conversion element 200B of FIG. 4A when the microstructures 242, 242A, and 242B are respectively configured on the first surface 240S1 of the heat conduction and diffusion substrate 240. As shown in Table 1, compared with a maximum temperature of approximately 232.97 degrees Celsius of the wavelength conversion layer of a conventional wavelength conversion element, a maximum temperature of the wavelength conversion layer 230 of the wavelength conversion element provided by the embodiments of the disclosure is reduced by 20 degrees to 30 degrees Celsius. That is, when the wavelength conversion elements 200, 200A, and 200B are rotated, airflow turbulence is increased due to the presence of the microstructures 242, 242A, and 242B. In this way, the temperature of the wavelength conversion layer 230 is thereby further reduced.

7

TABLE 1

| Microstructures | Maximum temperature of wavelength conversion layer (degrees Celsius) |
|---|---|
| 242 | 215.73 |
| 242A | 207.23 |
| 242B | 199.69 |

Figure 5:
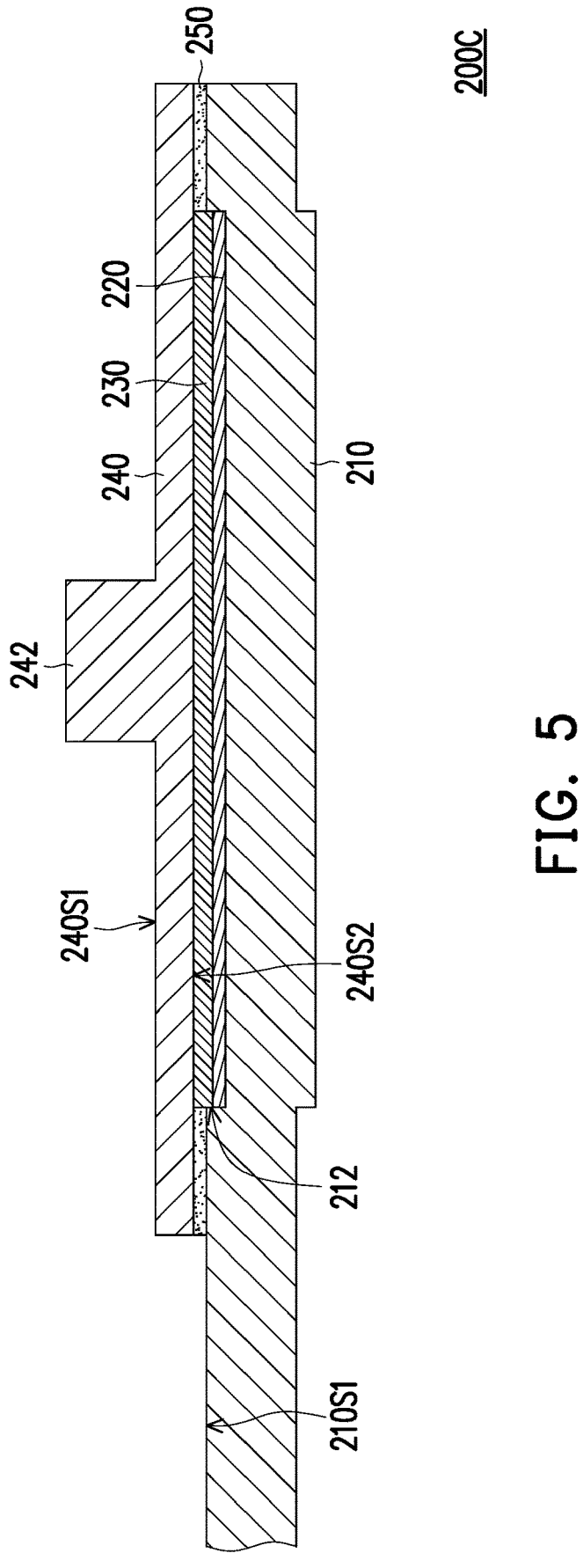
FIG. 5 is a schematic cross-sectional view of a wavelength conversion element according to a fourth embodiment of the disclosure.

FIG. 5 is a schematic cross-sectional view of a wavelength conversion element according to a fourth embodiment of the disclosure. Referring to FIG. 5, a main difference between a wavelength conversion element 200C and the wavelength conversion element 200 of FIG. 2A is as follows: the reflective layer 220 and a portion of the wavelength conversion layer 230 are disposed in the groove 212. A projection area of the groove 212 is, for example, less than a projection area of the heat conduction and diffusion substrate 240. Besides, in the embodiment, the wavelength conversion element 200C also includes an adhesive layer 250. The adhesive layer 250 is disposed between the heat conduction and diffusion substrate 240 and the substrate 210 and is adjacent and connected to the wavelength conversion layer 230. The adhesive layer 250 is configured to connect the heat conduction and diffusion substrate 240 and the substrate 210 and to prevent the heat conduction and diffusion substrate 240 from being thrown out and separated from the substrate 210 when the wavelength conversion element 200C is rotated. The advantages of the wavelength conversion element 200C provided by this embodiment of the disclosure are similar to that of the wavelength conversion element 200 of FIG. 2A, so description thereof is not repeated herein.

Figure 6:
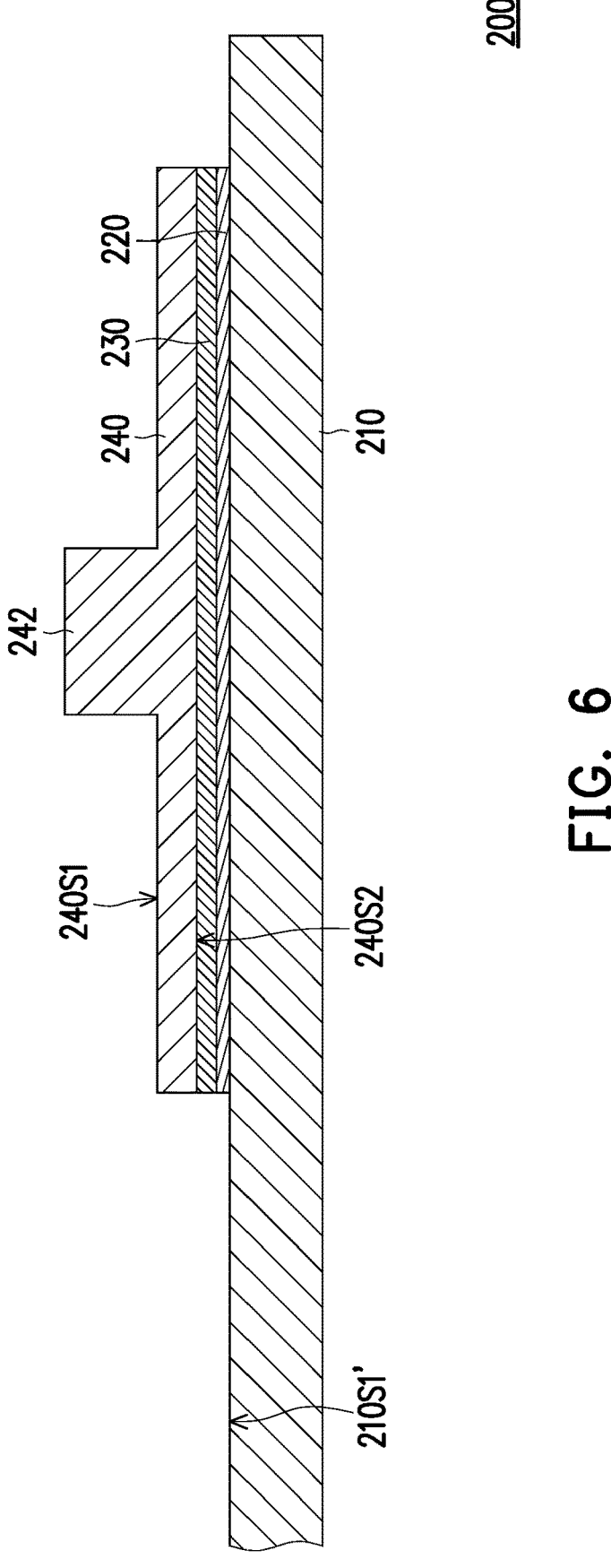
FIG. 6 is a schematic cross-sectional view of a wavelength conversion element according to a fifth embodiment of the disclosure.

FIG. 6 is a schematic cross-sectional view of a wavelength conversion element according to a fifth embodiment of the disclosure. Referring to FIG. 6, a main difference between a wavelength conversion element 200D and the wavelength conversion element 200 of FIG. 2A is as follows: the reflective layer 220 is disposed on a third surface 210S1', and the third surface 210S1' is a plane. The reflective layer 220 has adhesiveness and may fix the wavelength conversion layer 230 on the substrate 210. The advantages of the wavelength conversion element 200D provided by this embodiment of the disclosure are similar to that of the wavelength conversion element 200 of FIG. 2A, so description thereof is not repeated herein.

In view of the foregoing, in the wavelength conversion element of an embodiment of the disclosure, since the wavelength conversion layer conducts the accumulated heat to the heat conduction and diffusion substrate through the heat conduction and diffusion substrate, the problem of thermal degradation of the wavelength conversion layer is mitigated, and the light energy conversion efficiency of the wavelength conversion layer is thereby improved. Since the projection apparatus of an embodiment of the disclosure uses the aforementioned wavelength conversion element, the projection apparatus may thus provide projection images featuring stable image quality.

The foregoing description of the preferred embodiments of the disclosure has been presented for purposes of illustration and description. It is not intended to be exhaustive or to limit the disclosure to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the disclosure and its best mode practical application, thereby to enable persons skilled in the art to understand the disclosure for various embodiments and with various modifications as are suited to the particular use or implementation contemplated. It is intended that the scope of the disclosure be defined by the claims appended hereto and their equivalents in which all terms are meant in their broadest reasonable sense unless otherwise indicated. Therefore, the term "the disclosure", "the present disclosure" or the like does not necessarily limit the claim scope to a specific embodiment, and the reference to particularly preferred exemplary embodiments of the disclosure does not imply a limitation on the disclosure, and no such limitation is to be inferred. The disclosure is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the disclosure. It should be appreciated that variations may be made in the embodiments described by persons skilled in the art without departing from the scope of the present disclosure as defined by the following claims. Moreover, no element and component in the present disclosure is intended to be dedicated to the public regardless of whether the element or component is explicitly recited in the following claims.

What is claimed is:

1. A wavelength conversion element, the wavelength conversion element is configured to receive an excitation light beam, the wavelength conversion element comprising a substrate, a wavelength conversion layer, a reflective layer, and a heat conduction and diffusion substrate, wherein:

the reflective layer is disposed between the substrate and the wavelength conversion layer, and the wavelength conversion layer is disposed between the heat conduction and diffusion substrate and the reflective layer, the wavelength conversion layer is configured to receive and convert the excitation light beam from the heat conduction and diffusion substrate into a converted light beam, the reflective layer is configured to reflect the converted light beam, and the heat conduction and diffusion substrate is configured to allow the excitation light beam and the converted light beam reflected by the reflective layer to pass through, and has a first surface and a second surface opposite to the first surface, wherein the second surface faces the wavelength conversion layer, the first surface comprises a plurality of microstructures, and the plurality of microstructures are configured to allow the excitation light beam and the converted light beam reflected by the reflective layer to pass through.

2. The wavelength conversion element according to claim 1, wherein the heat conduction and diffusion substrate is in direct contact with the substrate, and heat energy generated by the wavelength conversion layer is conducted to the substrate through the heat conduction and diffusion substrate.

3. The wavelength conversion element according to claim 1, wherein a thermal conductivity of the heat conduction and diffusion substrate is greater than a thermal conductivity of the wavelength conversion layer, and a light diffusion angle of the heat conduction and diffusion substrate is within a range of 0.5 degrees to 5 degrees.

4. The wavelength conversion element according to claim 1, wherein a thickness of the heat conduction and diffusion substrate is within a range of 0.5 mm to 1.5 mm, and a thickness of each of the plurality of microstructures is within a range of 0 mm to 1.0 mm.

5. The wavelength conversion element according to claim 1, wherein the plurality of microstructures are arc-shaped microstructures and are arranged in a ring shape around a center of the substrate.

6. The wavelength conversion element according to claim 1, wherein the plurality of microstructures are square microstructures, spherical microstructures, or radial microstructures, and the plurality of microstructures are arranged in an array and are arranged in a concentric ring shape around a center of the substrate.

7. The wavelength conversion element according to claim 1, wherein the substrate has a third surface, and the third surface comprises a groove, wherein the wavelength conversion layer, the reflective layer, and at least a portion of the heat conduction and diffusion substrate are arranged in the groove.

8. The wavelength conversion element according to claim 1, wherein the substrate has a third surface, and the third surface comprises a groove, wherein the reflective layer and a portion of the wavelength conversion layer are disposed in the groove.

9. The wavelength conversion element according to claim 8, further comprising an adhesive layer arranged between the heat conduction and diffusion substrate and the substrate.

10. The wavelength conversion element according to claim 1, wherein the substrate has a third surface, and the reflective layer is disposed on the third surface, wherein the third surface is a plane.

11. A projection apparatus, comprising an illumination system, a light valve, and a projection lens, wherein the illumination system is configured to provide an illumination light beam, the light valve is disposed on a transmission path of the illumination light beam and is configured to convert the illumination light beam into an image light beam, the projection lens is disposed on a transmission path of the image light beam and is configured to project the image light beam out of the projection apparatus, and the illumination system comprises a light source and a wavelength conversion element, wherein:

the light source is configured to emit an excitation light beam, the wavelength conversion element comprises a substrate, a wavelength conversion layer, a reflective layer, and a heat conduction and diffusion substrate, the reflective layer is disposed between the substrate and the wavelength conversion layer, and the wavelength conversion layer is disposed between the heat conduction and diffusion substrate and the reflective layer, the excitation light beam is incident on the wavelength conversion element, the excitation light beam passes through the heat conduction and diffusion substrate, is then received by the wavelength conversion layer, and is converted into a converted light beam, and the converted light beam is reflected by the reflective layer and passes through the heat conduction and diffusion substrate, and the heat conduction and diffusion substrate has a first surface and a second surface opposite to the first surface, wherein the second surface faces the wavelength conversion layer, the first surface comprises a plurality of microstructures, and the plurality of microstructures are configured to allow the excitation light beam and the converted light beam reflected by the reflective layer to pass through.

12. The projection apparatus according to claim 11, wherein the heat conduction and diffusion substrate is in direct contact with the substrate, such that heat energy generated by the wavelength conversion layer is conducted to the substrate through the heat conduction and diffusion substrate.

13. The projection apparatus according to claim 11, wherein a thermal conductivity of the heat conduction and diffusion substrate is greater than a thermal conductivity of the wavelength conversion layer, and a light diffusion angle of the heat conduction and diffusion substrate is within a range of 0.5 degrees to 5 degrees.

14. The projection apparatus according to claim 11, wherein a thickness of the heat conduction and diffusion substrate is within a range of 0.5 mm to 1.5 mm, and a thickness of each of the plurality of microstructures is within a range of 0 mm to 1.0 mm.

15. The projection apparatus according to claim 11, wherein the plurality of microstructures are arc-shaped microstructures and are arranged in a ring shape around a center of the substrate.

16. The projection apparatus according to claim 11, wherein the plurality of microstructures are square microstructures, spherical microstructures, or radial microstructures, and the plurality of microstructures are arranged in an array and are arranged in a concentric ring shape around a center of the substrate.

17. The projection apparatus according to claim 11, wherein the substrate has a third surface, and the third surface comprises a groove, wherein the wavelength conversion layer, the reflective layer, and at least a portion of the heat conduction and diffusion substrate are arranged in the groove.

18. The projection apparatus according to claim 11, wherein the substrate has a third surface, and the third surface comprises a groove, wherein the reflective layer and a portion of the wavelength conversion layer are disposed in the groove.

19. The projection apparatus according to claim 18, further comprising an adhesive layer arranged between the heat conduction and diffusion substrate and the substrate.

20. The projection apparatus according to claim 11, wherein the substrate has a third surface, and the reflective layer is disposed on the third surface, wherein the third surface is a plane.

* * * * *